United States Patent
Cheng et al.

(10) Patent No.: US 9,287,264 B1
(45) Date of Patent: Mar. 15, 2016

(54) EPITAXIALLY GROWN SILICON GERMANIUM CHANNEL FINFET WITH SILICON UNDERLAYER

(71) Applicant: GLOBALFOUNDRIES INC., Grand Cayman (KY)

(72) Inventors: Kangguo Cheng, Schenectady, NY (US); Eric C. T. Harley, Bel Air, MD (US); Judson R. Holt, Wappingers Falls, NY (US); Gauri V. Karve, Cohoes, NY (US); Yue Ke, Hopewell Junction, NY (US); Derrick Liu, Albany, NY (US); Timothy J. McArdle, Hopewell Junction, NY (US); Shogo Mochizuki, Clifton Park, NY (US); Alexander Reznicek, Troy, NY (US); Melissa A. Smith, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/561,395

(22) Filed: Dec. 5, 2014

(51) Int. Cl.
| | |
|---|---|
| H01L 29/78 | (2006.01) |
| H01L 21/8238 | (2006.01) |
| H01L 27/092 | (2006.01) |
| H01L 21/84 | (2006.01) |
| H01L 29/36 | (2006.01) |
| H01L 29/20 | (2006.01) |
| H01L 29/16 | (2006.01) |
| H01L 27/12 | (2006.01) |

(52) U.S. Cl.
CPC .......... *H01L 27/0924* (2013.01); *H01L 21/845* (2013.01); *H01L 27/1211* (2013.01); *H01L 29/16* (2013.01); *H01L 29/20* (2013.01); *H01L 29/36* (2013.01)

(58) Field of Classification Search
CPC ............ H01L 29/7851; H01L 27/0886; H01L 29/66795; H01L 29/785; H01L 27/0924; H01L 21/823821
USPC .................................................... 438/283, 284
See application file for complete search history.

(56) References Cited

U.S. PATENT DOCUMENTS

| | | | |
|---|---|---|---|
| 6,933,183 B2 | 8/2005 | Beintner et al. | |
| 8,129,800 B2 | 3/2012 | Yun et al. | |
| 8,658,505 B2 | 2/2014 | Cai et al. | |
| 2013/0161694 A1* | 6/2013 | Adam ............. | H01L 21/823807 257/192 |
| 2013/0217204 A1* | 8/2013 | Park ................ | H01L 21/823431 438/424 |
| 2013/0273711 A1 | 10/2013 | Liu et al. | |
| 2013/0330889 A1* | 12/2013 | Yin ................. | H01L 21/823821 438/197 |
| 2014/0027860 A1 | 1/2014 | Glass et al. | |
| 2014/0097506 A1 | 4/2014 | Liaw | |
| 2014/0103455 A1 | 4/2014 | Ando et al. | |
| 2014/0159162 A1 | 6/2014 | Cai et al. | |

* cited by examiner

*Primary Examiner* — Evan Pert
*Assistant Examiner* — Changhyun Yi
(74) *Attorney, Agent, or Firm* — Yuanmin Cai; Hoffman Warnick LLC

(57) ABSTRACT

Embodiments of the present invention provide a method for epitaxially growing a FinFET. One method may include providing a semiconductor substrate including an insulator and an underlayer; forming a channel layer on the semiconductor substrate using epitaxial growth; etching a recess into the channel layer and epitaxially regrowing a portion on the channel layer; etching the channel layer and the underlayer to form fins; forming a gate structure and a set of spacers; etching a source drain region into the channel layer; and forming a source drain material in the source drain region.

12 Claims, 7 Drawing Sheets

US 9,287,264 B1

EPITAXIALLY GROWN SILICON GERMANIUM CHANNEL FINFET WITH SILICON UNDERLAYER

BACKGROUND OF THE INVENTION

The present invention relates generally to semiconductor devices, and more particularly to an epitaxially grown silicon germanium (SiGe) channel FinFET with a silicon (Si) underlayer for a source drain recess etch stop.

Integrated circuit (IC) devices, such as fin field effect transistors (FinFETs), are widely used in logic, memory, processors, and other integrated circuit devices. As the size of the active region of FinFETs continues to decrease, the influence of the source drain region on an electric field or potential in the channel region may increase, known as the short channel effect. Maintaining mobility improvement and short channel control as integrated circuit device dimensions continue to scale down continues to be a challenge in semiconductor device fabrication.

SUMMARY

According to one embodiment of the present invention, a method for epitaxially growing a FinFET is provided, the method comprising: providing a semiconductor substrate, wherein the semiconductor substrate includes at least an insulator and an underlayer; forming a channel layer on the semiconductor substrate using epitaxial growth; etching a recess into the channel layer; regrowing a portion of the channel layer using epitaxial growth; etching one or more recesses into the channel layer and the underlayer to form a plurality of fins; forming a gate structure and a set of spacers, wherein the set of spacers are formed on sidewalls of the gate structure; etching a source drain region into the channel layer; and forming a source drain material in the source drain region using epitaxial growth.

According to another embodiment of the present invention, a semiconductor structure is provided, the semiconductor structure comprising: a channel layer disposed on a semiconductor substrate, wherein the semiconductor substrate comprises at least an underlayer; a plurality of fins patterned in the channel layer and the underlayer, wherein a first set of the plurality of fins are in an NFET region and a second set of the plurality of fins are in a PFET region; a gate structure and a set of spacers, wherein a portion of the gate structure and the set of spacers are disposed around the plurality of fins; and a source drain region formed adjacent to the gate structure, wherein a source drain material is present in the source drain region.

DETAILED DESCRIPTION

Figure 1:
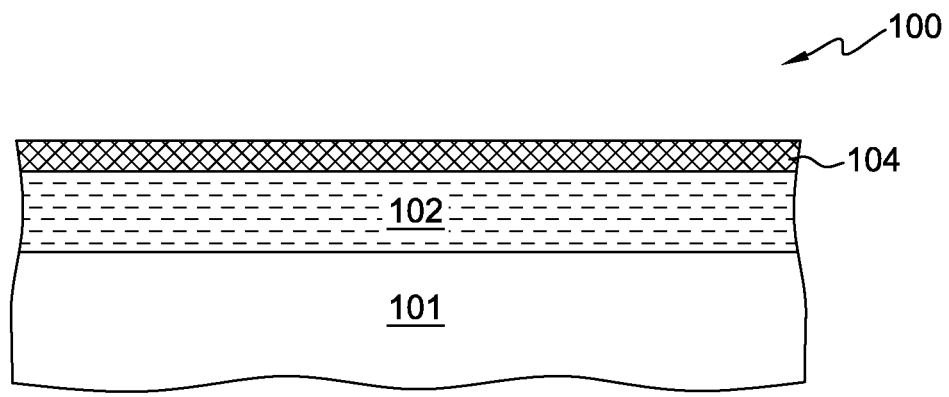
FIG. 1 depicts a cross-sectional view of a starting substrate of a semiconductor, in accordance with an embodiment of the present invention.

Embodiments of the present invention provide a fabrication process for an epitaxially grown SiGe channel FinFET with a Si underlayer for a source drain recess etch stop. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "on", "over", "overlying", "atop", "positioned on", or "positioned atop" mean that a first element, such as a first structure, is present on a second element, such as a second structure, wherein intervening elements, such as an interface structure, may be present between the first element and the second element. The terms "direct contact", "directly on", or "directly over" mean that a first element, such as a first structure, and a second element, such as a second structure, are connected without any intermediary conducting, insulating, or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Referring now to the figures, FIG. 1 depicts a cross-sectional view of an example of a starting substrate on which an epitaxially grown SiGe channel FinFET 100 with a Si underlayer may be formed. The starting substrate may be any substrate known in the art, for example, a silicon-on-insulator (SOI) substrate. In this exemplary embodiment, the starting substrate is a thin SOI, including layer 104, layer 102, and layer 101. Layer 104 is composed of thin Si, with a thickness of approximately 20 nm to 100 nm, with 50 nm to 70 nm being more typical. In this exemplary embodiment, layer 104 has a thickness of at least 5 nm to 10 nm. Layer 102 is a buried oxide (BOX), composed of $SiO_2$, with a typical thickness from 100 nm to 150 nm (approximately 145 nm thick in this embodiment). Layer 104 and layer 102 are disposed on layer 101 (approximately 875 micrometers in thickness), which is composed of, for example, Si. In another embodiment, a zero-level PFET counter-doping diode implant may be used to form a diode and prevent current leakage through the underlying Si layer by n-doping the Si layer. By using a masked implant (e.g., an oxide or nitride hard mask) before the NFET/PFET epitaxial deposition step (depicted in FIG. 2), the possible detrimental effects of the Si underlayer in the gate region (discussed below) are reduced or eliminated.

In other embodiments, a small amount of carbon (i.e., less than 1%), may be added to layer 104 during epitaxial deposition. This relieves strain on the system to stop dislocation formation during the epitaxial growth or subsequent high thermal budget processing. It also provides a junction profile definition by stopping dopants (e.g., boron) from diffusing into the SiGe channel underneath the gate.

Figure 2:
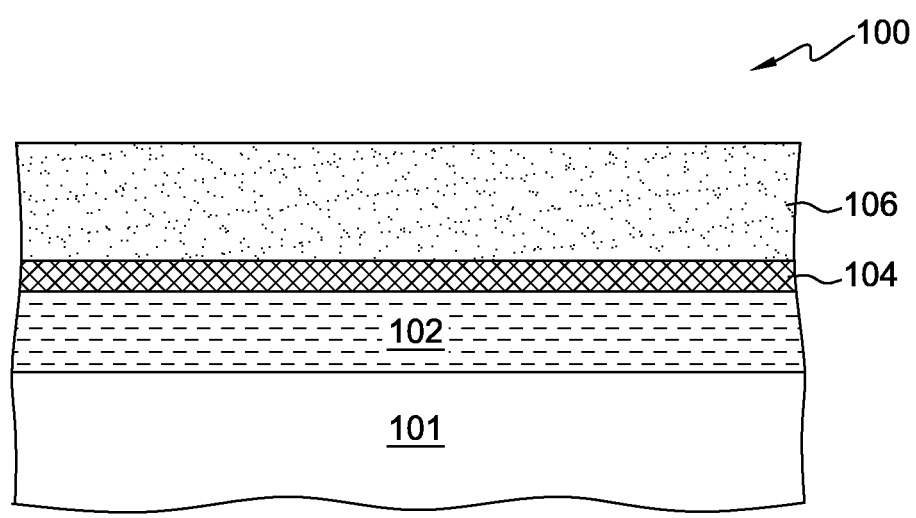
FIG. 2 depicts a cross-sectional view of epitaxial growth on the starting substrate of FIG. 1, in accordance with an embodiment of the present invention.

FIG. 2 depicts a cross-sectional view of the substrate after epitaxial growth of channel layer 106. In this exemplary embodiment, layer 106 is epitaxially grown on the top surface of layer 104, to a thickness of approximately 30 nm to 100 nm, with a thickness of 40 nm to 60 nm being more typical. In a preferred embodiment, layer 106 is composed of, for example, SiGe, and may have 20% to 50% of Ge density, with 25% to 30% of Ge density being preferred.

Figure 3:
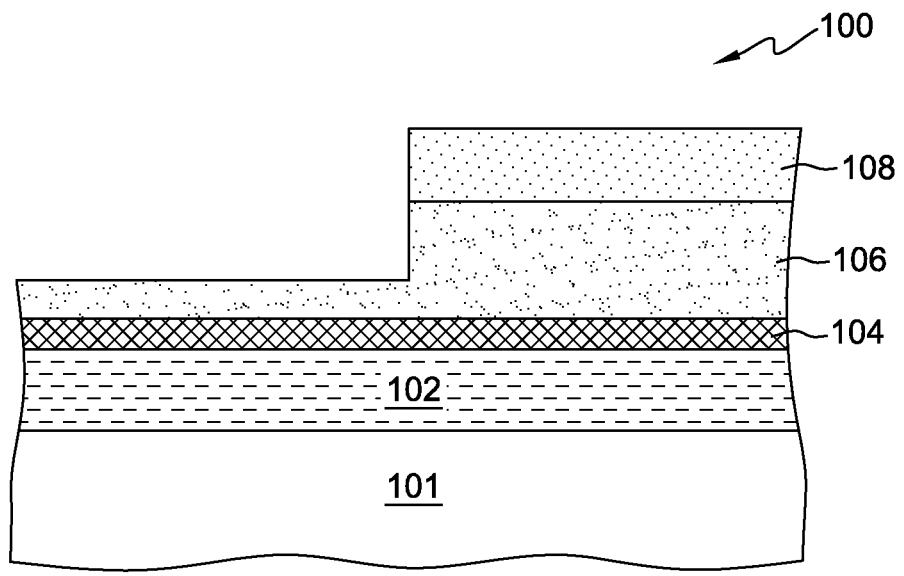
FIG. 3 depicts a cross-sectional view of etching selected parts of the semiconductor, in accordance with an embodiment of the present invention.

FIG. 3 depicts a cross-sectional view of the substrate after the deposition of hard mask 108 and a timed etch. In this exemplary embodiment, hard mask 108 is deposited over the top surface of layer 106, using known deposition techniques. Hard mask 108 may be composed of an oxide, a nitride, an oxynitride, or any suitable masking material. After the deposition of hard mask 108, layer 106 is partially etched, so that a thickness of approximately 5 nm to 10 nm of layer 106 remains. In this exemplary embodiment, reactive ion etching (RIE) is used to selectively recess layer 106. In other embodiments, any suitable etching technique may be used to completely remove layer 106 in one processing step.

Figure 4:
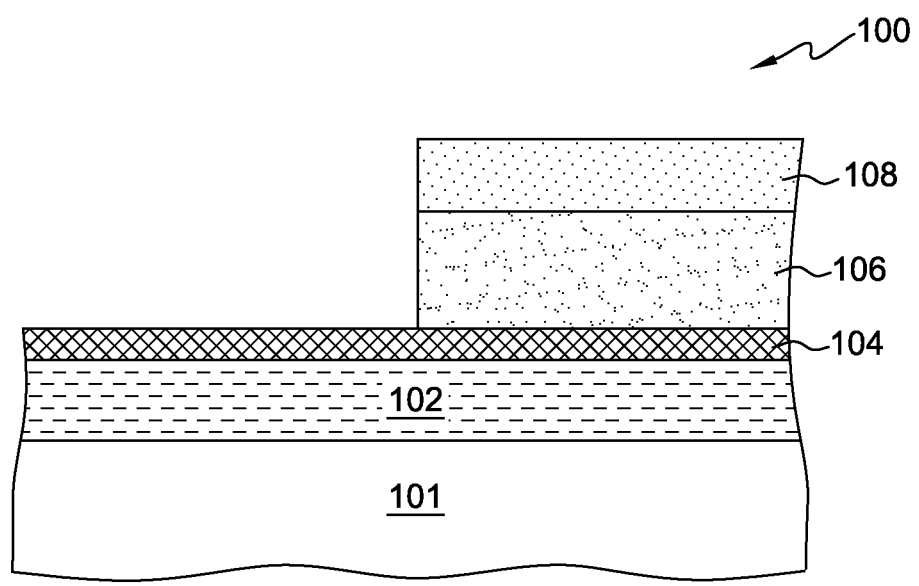
FIG. 4 depicts a cross-sectional view of the semiconductor of FIG. 3 after a wet etch process, in accordance with an embodiment of the present invention.

Referring now to FIG. 4, a cross-sectional view of the substrate after a wet etch process is depicted. In this exemplary embodiment, a hot SC1 wet etch is used, where layer 106 is etched down to layer 104. Hot SC1 uses a hydrogen peroxide ($H_2O_2$), ammonium hydroxide ($NH_4OH$), and dionized water solution, in a 1:1:5 ratio, held at a temperature of approximately 70° C. The etch rate is approximately 0.3 nm/min. at 70° C. Adjusting the temperature allows the etch rate to be controlled. The hydrogen peroxide promotes the formation of an oxide, while the ammonium hydroxide slowly etches the oxide, stopping with high selectivity on layer 104. In other embodiments, after the wet etching process, a diode implantation process may occur.

Figure 5:
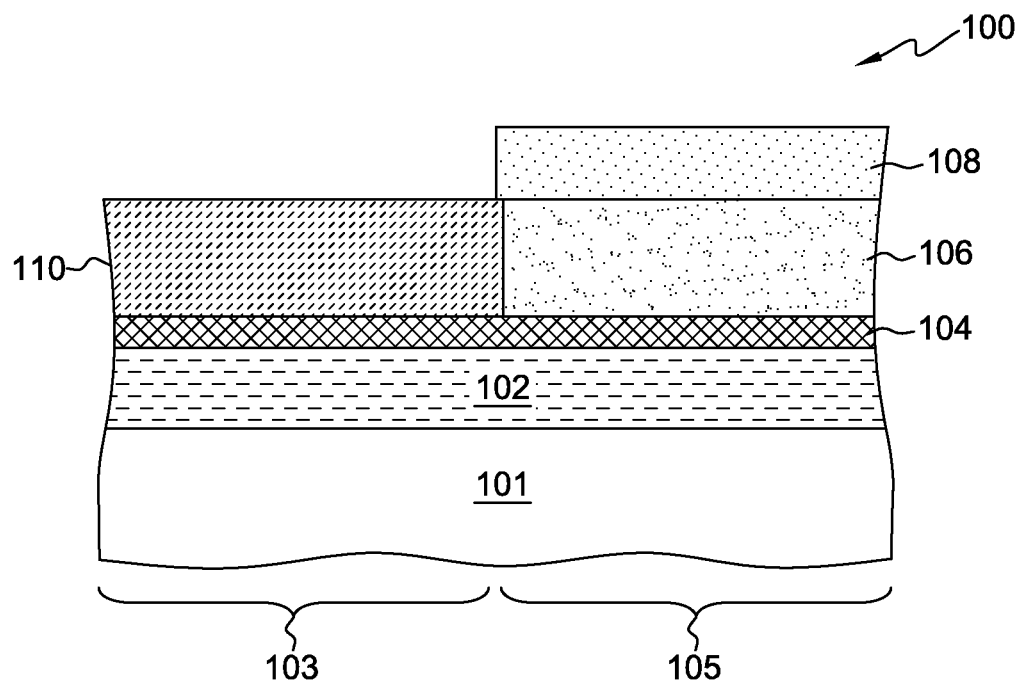
FIG. 5 depicts a cross-sectional view of epitaxial regrowth for an NFET, in accordance with an embodiment of the present invention.

FIG. 5 depicts a cross-sectional view of the substrate after layer 110 is regrown on layer 104. In this exemplary embodiment, a Si epitaxial layer 110 is regrown on layer 104, so that layer 104 and layer 110 are both composed of Si, facilitating low strain and low defect epitaxy. In one embodiment, after the epitaxial regrowth of layer 104, a planarization process, such as chemical mechanical polishing (CMP), is used to remove hard mask 108. In other embodiments, layer 110 is epitaxially regrown for an NFET (region 103) and may be composed of a material with a low percentage (20%-30%) of Ge, for example, SiGe. In yet another embodiment, layer 110 may be composed of any III-V material, for example, InP, GaAs, or InGaAs.

Figure 6:
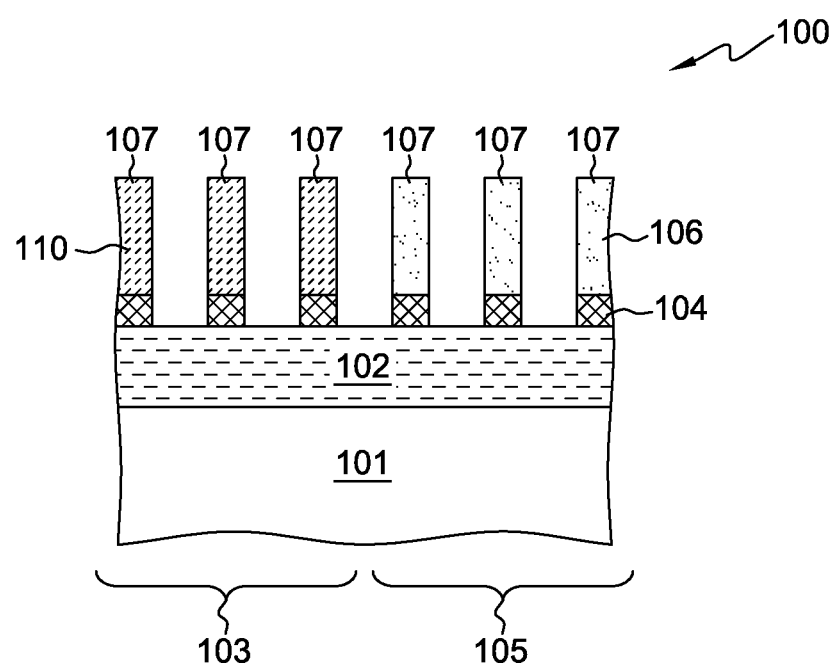
FIG. 6 depicts a cross-sectional view of the formation of fins, in accordance with an embodiment of the present invention.

Referring now to FIG. 6, fins 107 are formed. In this exemplary embodiment, a set of fins 107 are in NFET region 103 and a set of fins 107 are in PFET region 105. It should be noted that a "set" may refer to any number of fins 107, including a single fin. In other embodiments, fins 107 may be formed using any standard integration processes, for example, a recessed and regrown PFET or use of replacement fins. In this exemplary embodiment, fins 107 in NFET region 103 are composed of the same material as layer 104 (i.e., Si). In other embodiments, layer 110 may be composed of any III-V material or a low percentage Ge material, as discussed above.

Figure 7A:
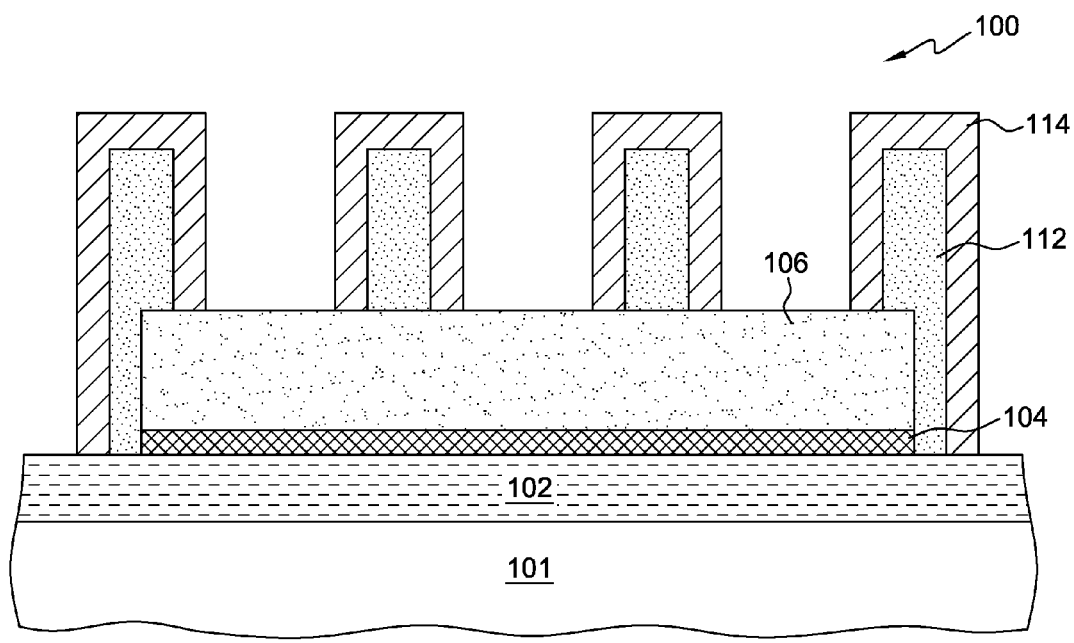
FIGS. 7A and 7B depict cross-sectional views of the formation of a gate structure around the fins of FIG. 6, in accordance with an embodiment of the present invention.
Figure 7B:
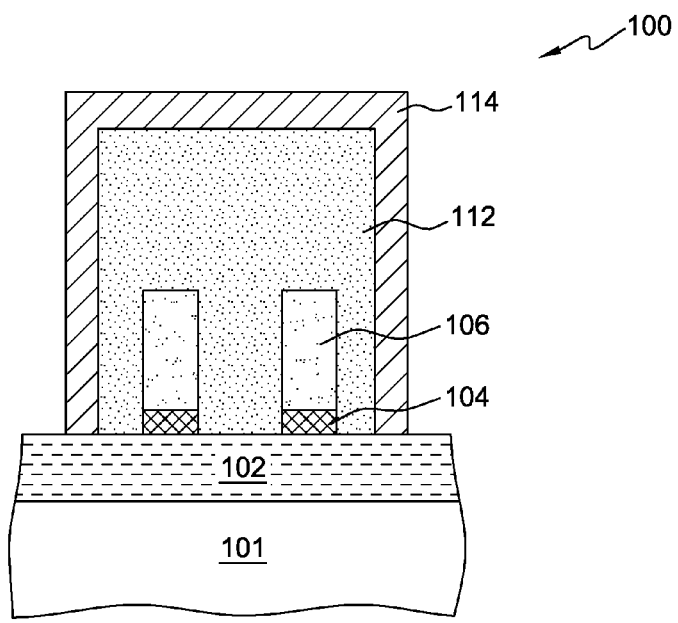

FIGS. 7A and 7B depict a perpendicular view through fins 107 and a parallel view through gates 110, respectively, after the formation of gates 112 and spacers 114. Gates 112 and spacers 114 may be formed using standard processes in the art. Gates 112 may be formed around a central portion of fins 107. Gates 112 may include a gate electrode, a dielectric layer, and a gate hard mask (not shown). Spacers 114 may subsequently be formed on the sides of gates 112 at a perpendicular orientation relative to fins 107. Spacers 114 may be composed of a dielectric, such as a nitride, oxide, oxynitride, or a combination thereof.

Figure 8A:
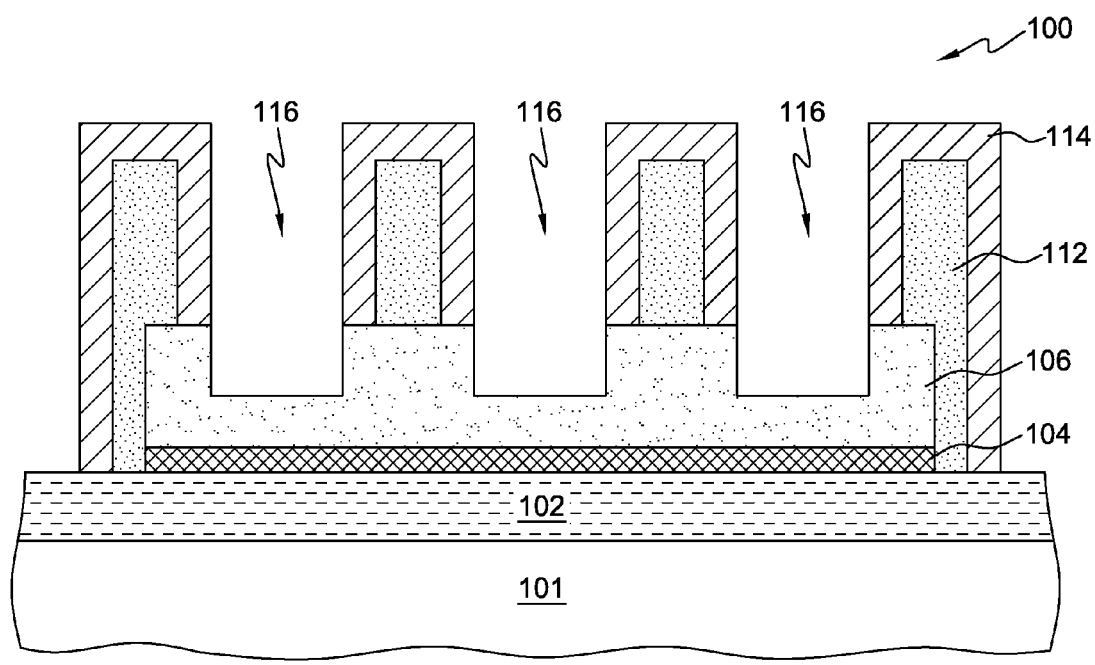
FIGS. 8A and 8B depict cross-sectional views of the formation of a source drain region adjacent to the gate structure of FIGS. 7A and 7B, in accordance with an embodiment of the present invention.
Figure 8B:
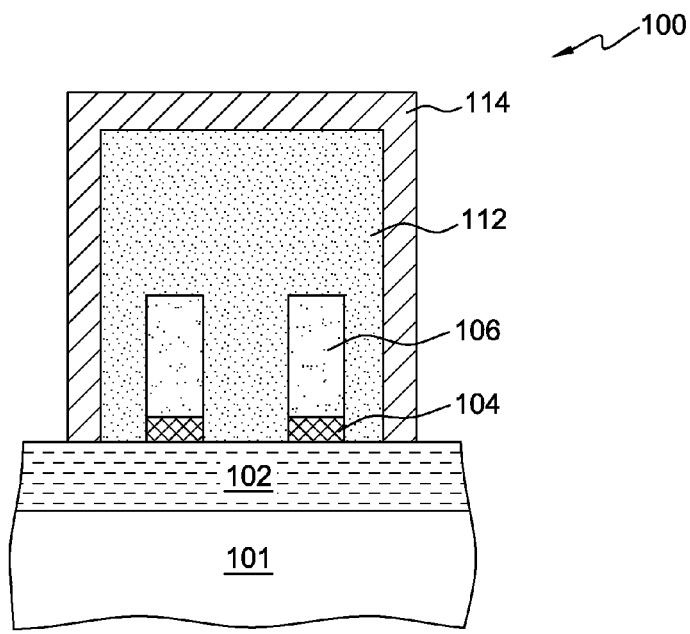

Referring now to FIGS. 8A and 8B the formation of source drain regions 116 is depicted, in accordance with an embodiment of the present invention. In this exemplary embodiment, source drain regions 116 are formed by etching the semiconductor substrate using a timed reactive ion etch (RIE) process known in the art. The depth of the RIE is approximately 50% to 80% of the overall thickness of layer 106. This helps in alleviating any possibility of etch punch through into layer 102.

Figure 9A:
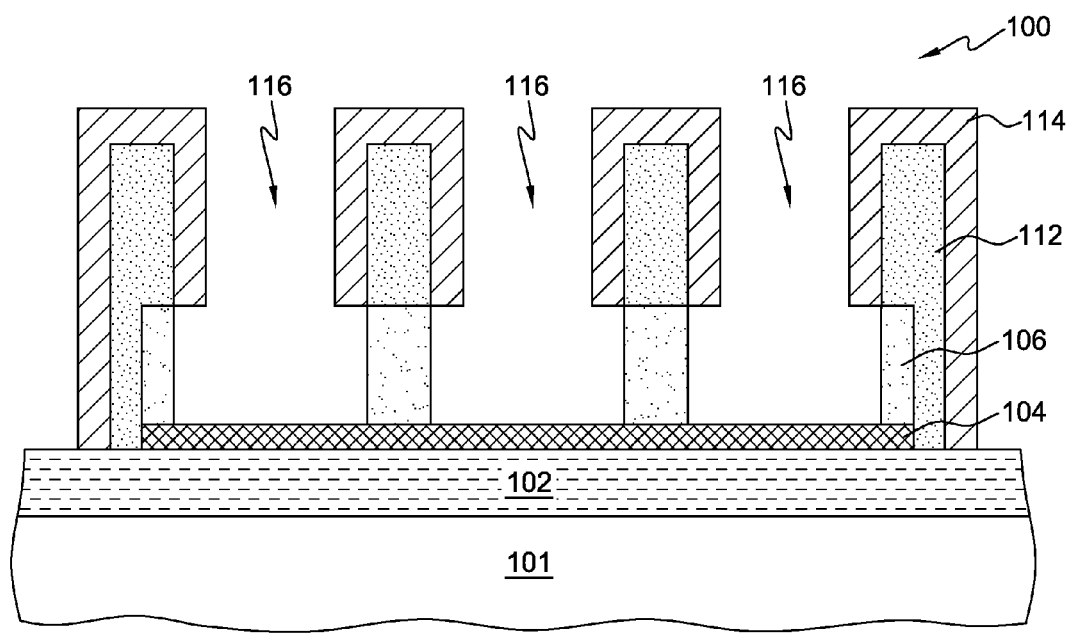
FIGS. 9A and 9B depict cross-sectional views of a wet etch process of the source drain region of FIGS. 8A and 8B, in accordance with an embodiment of the present invention.
Figure 9B:
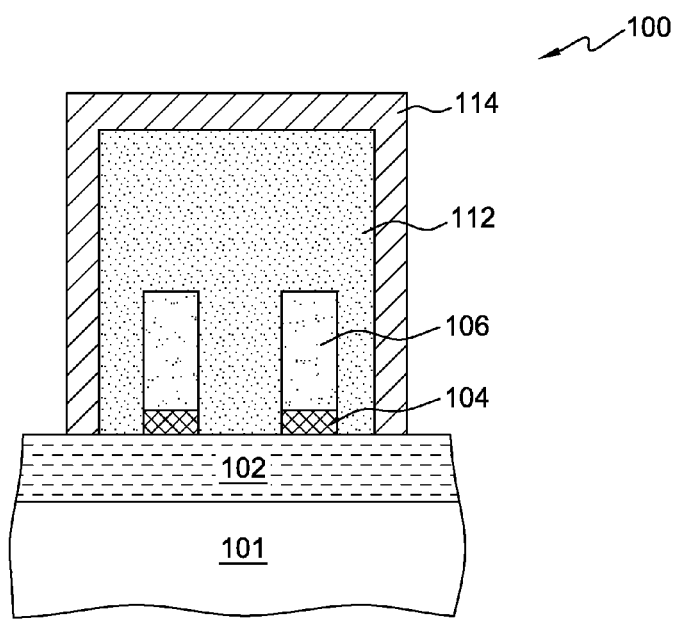

FIGS. 9A and 9B depict the further etching of source drain regions 116, in accordance with an embodiment of the present invention. In this exemplary embodiment, a wet etch, such as an SC1 wet etch (as described above), is used to further etch out layer 106, to form source drain regions 116. As the hot SC1 wet etch is isotropic (i.e., uniform in all directions), spacers 114 are undercut, leading to improved stress and junction proximity.

In other embodiments, a thermal mixing process is employed after the formation of source drain regions 116. The thermal mixing process allows the Ge to diffuse into the Si, forming a SiGe region at the bottom of the device, which creates a uniform SiGe channel material leading to an improved device variability. The thermal mixing is performed by annealing the semiconductor to a temperature sufficient enough to cause diffusion of the Ge out of the epitaxial SiGe layer 106, and into the Si underlayer (layer 104). In this exemplary embodiment, the thermal mixing process is performed at a temperature range from 800° C. to 1200° C., with a preferred temperature range from 900° C. to 1050° C. The semiconductor is held in an inert atmosphere during the thermal mixing process, which includes at least one inert gas, such as $N_2$, Ar, He, Xe, Kr, or Ne, for a time period ranging from 1 minute to 30 minutes, depending on the thermal mixing temperature used. In a preferred embodiment, the semiconductor is held at a temperature of approximately 950° C. for 3 minutes to 10 minutes.

Figure 10A:
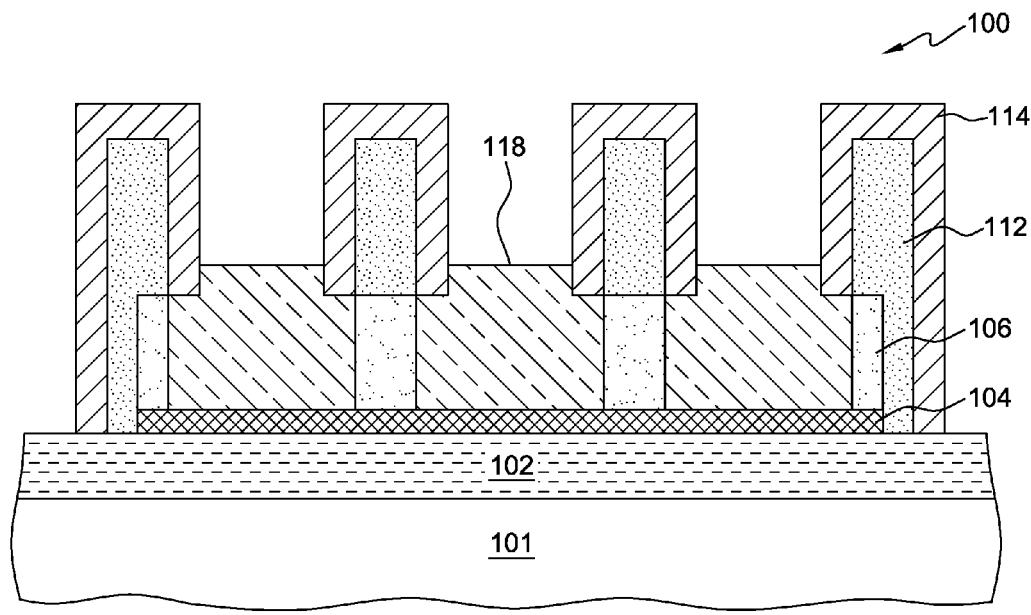
FIGS. 10A and 10B depict cross-sectional views of the epitaxial regrowth of a source drain material in the source drain region of FIGS. 9A and 9B, in accordance with an embodiment of the present invention.
Figure 10B:
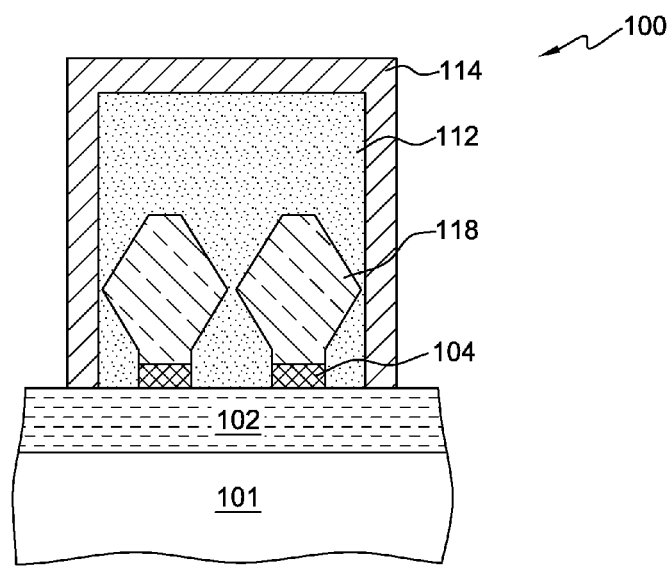

FIGS. 10A and 10B depict the epitaxial regrowth of source drain material 118 in source drain regions 116, in accordance with an embodiment of the present invention. In this exemplary embodiment, source drain material 118 is composed of SiGe, where Ge has a concentration, for example, between 30% and 60%. In this exemplary embodiment, epitaxial growth in the source drain regions 116 is completed in one processing step. In other embodiments, epitaxial growth may be completed in more than one processing step. For example, for a PFET, a buffer layer (not depicted) may first be grown with one doping concentration. A second main layer (not depicted) is then grown, for example, SiGe with a second doping concentration. In a preferred embodiment, the second doping concentration is higher than the first doping concentration. A third capping layer (not depicted) is grown which may be composed of SiGe or Si, for example. The doping concentration of the third capping layer may be the same as the doping concentration of the second layer, or may be a higher doping concentration than the second layer. Alternatively, for an NFET, Si or carbon doped silicon (Si:C) may be used for the growth material, where the C content is approximately 1% to 4%, with a preferred C content of 1% to 2.5%.

Having described embodiments for an epitaxially grown SiGe channel FinFET with a Si underlayer for a source drain region etch stop and methods of fabrication (which are intended to be illustrative and not limiting), it is noted that modifications and variations may be made by persons skilled in the art in light of the above teachings. It is, therefore, to be understood that changes may be made in the particular embodiments disclosed which are within the scope of the invention, as outlined by the appended claims.

In certain embodiments, the fabrication steps depicted above may be included on a semiconductor substrate, consisting of many devices and one or more wiring levels, to form an integrated circuit chip. The resulting integrated circuit chip(s) can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications, to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method for epitaxially growing a FinFET, the method comprising:
    providing a semiconductor substrate, wherein the semiconductor substrate includes at least an insulator and an underlayer;
    forming a channel layer on the semiconductor substrate using epitaxial growth;
    etching a recess into the channel layer;
    regrowing a portion of the channel layer using epitaxial growth;
    etching one or more recesses into the channel layer and the underlayer to form a plurality of fins;
    forming a gate structure and a set of spacers, wherein the set of spacers are formed on sidewalls of the gate structure;
    etching a source drain region into the channel layer; and
    forming a source drain material in the source drain region using epitaxial growth.

2. The method of claim 1, wherein forming a source drain material in the source drain region using epitaxial growth comprises:
    growing a buffer layer with a first doping concentration;
    growing a main layer on the buffer layer, wherein the main layer has a second doping concentration; and
    growing a capping layer on the main layer, wherein the capping layer has a third doping concentration.

3. The method of claim 1, further comprising forming a diode by using a zero-level PFET counter-doping implant.

4. The method of claim 1, wherein forming a channel layer on the semiconductor substrate comprises adding less than 1% carbon to the underlayer.

5. The method of claim 1, wherein etching a recess into the channel layer comprises using an etching process which removes all of the channel layer.

6. The method of claim 1, wherein etching a recess into the channel layer comprises:
    depositing a hard mask over a portion of the channel layer;
    etching a portion of the channel layer not covered by the hard mask; and
    removing a remaining portion of the channel layer using a hot SC1 wet etch.

7. The method of claim 6, wherein the remaining portion of the channel layer is greater than or equal to 5 nm and less than or equal to 10 nm.

8. The method of claim 1, wherein the regrown portion of the channel layer comprises one of: Si, SiGe, or a III-V material.

9. The method of claim 1, wherein the plurality of fins comprise a first set of fins in an NFET region and a second set of fins in a PFET region.

10. The method of claim 1, wherein etching a source drain region into the channel layer comprises using a timed reactive ion etch (RIE) process and a hot SC1 wet etch process.

11. The method of claim 1, wherein the source drain region is etched to a depth of greater than or equal to 50% of the channel layer and less than or equal to 80% of the channel layer.

12. The method of claim 1, wherein a thermal mixing process is used after etching the source drain region into the channel layer.

* * * * *